United States Patent [19]

Cornu et al.

[11] 3,987,479
[45] Oct. 19, 1976

[54] SEMICONDUCTOR POWER COMPONENT

[75] Inventors: Jozef Cornu, Stekene, Belgium; Erich Weisshaar, Baden, Switzerland

[73] Assignee: BBC Brown Boveri & Company Limited, Baden, Switzerland

[22] Filed: June 27, 1974

[21] Appl. No.: 483,813

[30] Foreign Application Priority Data
July 6, 1973 Switzerland............... 9867/73

[52] U.S. Cl............... 357/55; 357/38
[51] Int. Cl.² ................. H01L 29/06
[58] Field of Search............... 357/38, 39, 55

[56] References Cited
UNITED STATES PATENTS

| 3,153,752 | 10/1964 | Teszner | 357/55 |
| 3,437,886 | 4/1969 | Edqvist et al. | 357/38 |
| 3,437,889 | 4/1969 | Eugster | 357/38 |
| 3,470,036 | 9/1969 | Svedberg | 357/38 |
| 3,491,272 | 1/1970 | Huth et al. | 357/38 |
| 3,575,644 | 4/1971 | Huth et al. | 357/55 |
| 3,588,632 | 6/1971 | Nakata | 357/55 |
| 3,611,554 | 10/1971 | Garrett | 357/38 |
| 3,628,294 | 12/1971 | Satter et al. | 357/55 |

FOREIGN PATENTS OR APPLICATIONS

| 1,360,744 | 4/1964 | France | 357/55 |
| 1,057,214 | 2/1967 | United Kingdom | 357/55 |

Primary Examiner—Michael J. Lynch
Assistant Examiner—Joseph E. Clawson, Jr.
Attorney, Agent, or Firm—Oblon, Fisher, Spivak, McClelland & Maier

[57] ABSTRACT

A semiconductor power element comprising two successive opposed polarity planar pn junctions, said element being positively tapered on its lateral surface in the regions of both pn junctions to form an average angle of both tapers of between 30° and 60°.

3 Claims, 14 Drawing Figures

SEMICONDUCTOR POWER COMPONENT

BACKGROUND OF THE INVENTION

1. Field of the Invention

The invention concerns a semiconductor power component with two successive opposed polarity planar pn junctions which has positive tapers on its lateral surface in the vicinity of both pn junctions.

2. Description of the Prior Art

Semiconductor power elements with two successive opposed polarity pn junctions can, for example, be used as thyristors (cf., e.g., Kohl, ETZ-A 89 (1968) pp. 131–135: Ref. 1) where at least one more pn junction than mentioned is provided, or even as voltage limiters (cf., e.g., Lawatsch and Weisshaar, Brown Boveri Review, Sept. 1972, Vol. 59, pp. 476–482: Ref. 2). In practice the pn junctions are nearly always planar since non-planar pn junctions give rise to technological and even electrical difficulties.

By "positive taper" is meant a slope in the lateral surface of the semiconductor power element with respect to the plane of the pn junction such that the cross section of the element shrinks as the metallurgic pn transition is traversed in the direction of the more weakly doped of the two adjacent zones, or in other words, such that the cross section of the element in the more highly doped region is greater, and/or in the more weakly doped region less than that in the plane of the metallurgic pn transition (cf., e.g., Davies and Gentry, IEEE Trans. on El. Dev. Vol. ED-11, July 1964, pp. 313–323: Ref. 3; or Cornu, IEEE Trans. on El. Dev. Vol. ED-20, April 1973, pp. 347–352: Ref. 4). In the reverse case, one speaks of a "negative taper."

The terms "positive" and "negative" taper imply unsymmetrically doped pn-transitions, i.e., of a type in which a more highly doped region adjoins a more weakly doped one.

The purpose of the taper is to reduce the electric field strength at the lateral surface so that any breakdown occurs inside the semiconductor element and never out over the surface. Surface breakdown is much more difficult to control and readily leads to destruction of the element. With positive taper, angles of about 30° (Ref. 1 p. 132, left column, second paragraph from the bottom) are sufficient to guarantee restriction of an avalanche breakdown to the interior. With negative tapers, however, angles less than 1° are necessary to be able to withstand voltages of the order to 3.5 KV. This results in a very considerable loss in usable element surface and introduces cooling problems in addition to others, since the taper cannot practically be brought into contact with a heat sink.

Consequently various methods have already been disclosed for avoiding the aforementioned problems.

Thus, for example, Kohl (Solid-State Electronics 1968, Vol. II, pp. 501–502: Ref. 5) proposed a mesa-shaped lateral contour with double phase.

Otsuka (IEE Conf. Publ. No. 53,Part 1 (1969) pp. 32–38: Ref. 6) proposed putting a ring-shaped groove in the silicon wafer of the element which cuts the forward blocking pn transition in such a way that the cross sectional area decreases with passage through the pn transition into the more weakly doped region.

Lastly, Gerecke (e.g., DT-05 No. 1,439,215: Ref. 7), early in 1962, proposed a dovetailed shape for the semiconductor element.

Further attempts at solutions in this vein are known, e.g., in U.S. Pat. No. 3,575,644 (Ref. 8) and in DT-AS No. 1,251,440 (Ref. 9).

Thus far, however, none of the known solutions have been able to carry over into actual practice. The reason for this is probably that all known structures present great technological problems in manufacture and it was obviously not realized to what extent advantages were to be obtained by means of the structures. Such knowledge was lacking because the properties of the known structures important for a semiconductor power element have not thus far been understandable theoretically since the relationships in such structures can be described only by systems of complex differential equations not soluble in closed form (cf., e.g., Ref. 3 and 4).

The aim of the present invention is to select from the multiplicity of known structures, and point out the special properties of, those permitting the production of semiconductor power elements that withstand voltages even greater than 3500 volts, in which, therefore, avalanche breakdown occurs only above 3500 v.

SUMMARY OF THE INVENTION

It is therefore an object of the present invention to solve the above noted problems encountered in the prior art. Other objects will appear hereinafter.

These problems as well as others are solved in accordance with the invention by having the average angle of the two tapers in a semiconductor element of the type mentioned above always lie between 30° and 60°.

This solution was arrived at on the basis of a theoretical analysis of the electric field strength at the surface of a doubly positive tapered element of the aforementioned type with the help of electronic computers and was verified by experiment. Quite surprising and unpredictable advantages result which will be pointed out below in connection with the description of illustrative examples of a preferred embodiment of the present invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENT

Figure 1:
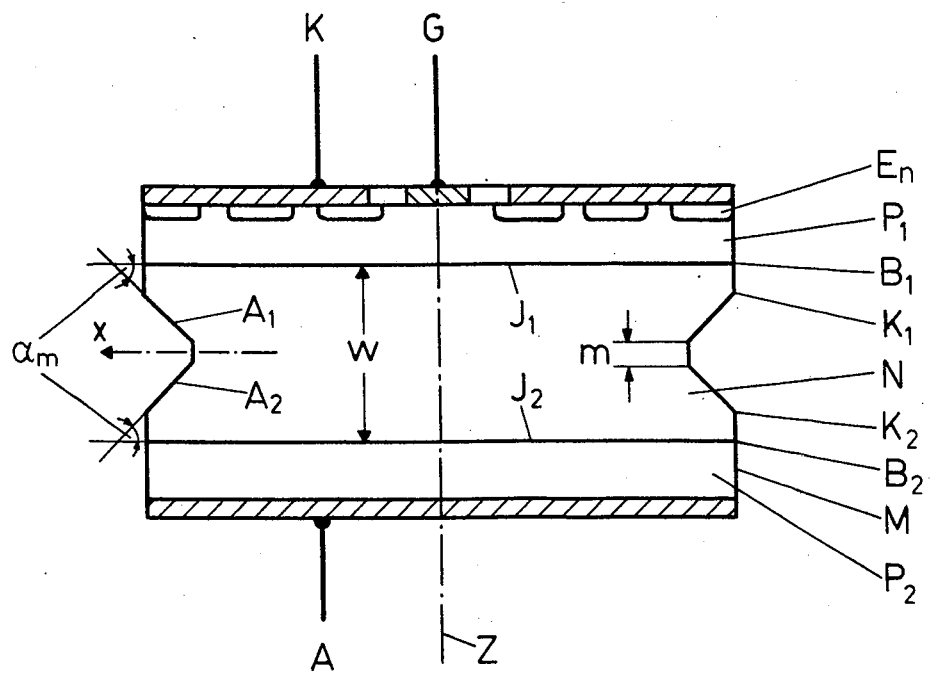
FIG. 1 schematically shows the cross section of a doubly positive tapered semiconductor power element with properties in accordance with the invention in which, in particular, the pn transitions appear at the surface outside the taper.

In FIG. 1 is shown a thyristor with emitter short circuits (cf., e.g., A Herlet in Sci. El., Vol. XII, No. 4 (1966) pp. 105–122, 120: Ref. 10) having a cathode lead K, an anode lead A and a control lead G. Further it has an n-doped emitter region pierced by shunts, a p-doped control region $P_1$, an n-doped base N and a p-doped base region $P_2$ on the anode end. The regions $P_1$ and $P_2$ are more heavily doped than region N and the regions $E_n$ are more heavily doped than region $P_1$. The pn junctions $J_1$ and $J_2$ terminate in the circles $B_1$ and $B_2$ on the lateral surface M of the element. The element is rotationally symmetric with respect to the central axis Z.

The element shown has a positive taper $A_1$ on its lateral surface M in the region of the pn junction $J_1$ and a positive taper $A_2$ in the region of the pn junction $J_2$. The average angle $\alpha_m$ of the tapers $A_1$ and $A_2$ is 45°. The circumferential groove produced by the two tapers $A_1$ and $A_2$ is symmetrically situated with respect to the two pn junctions $J_1$ and $J_2$. For reasons explained hereinafter, the notch is given a flat bottom so that it has a trapezoidal shape with the smaller base of length M.

Particularly noteworthy in the structure shown is the fact that the pn junctions $J_1$ and $J_2$ appear at the lateral surface outside the tapers $A_1$ and $A_2$.

Figure 2:
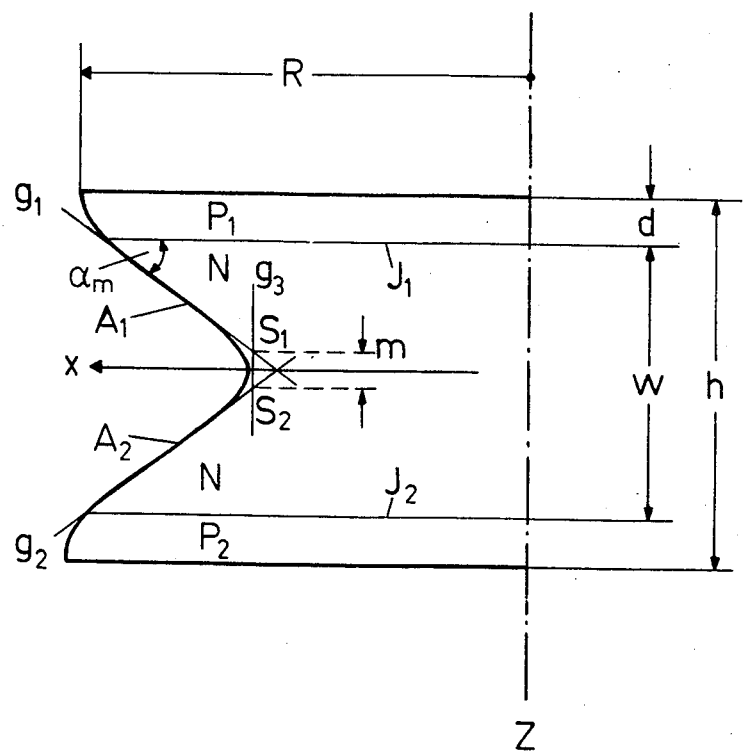
FIG. 2 shows the cross section of the side of an element in accordance with the present invention which was studied experimentally with blocked voltages of 6000 V.
Figure 3:
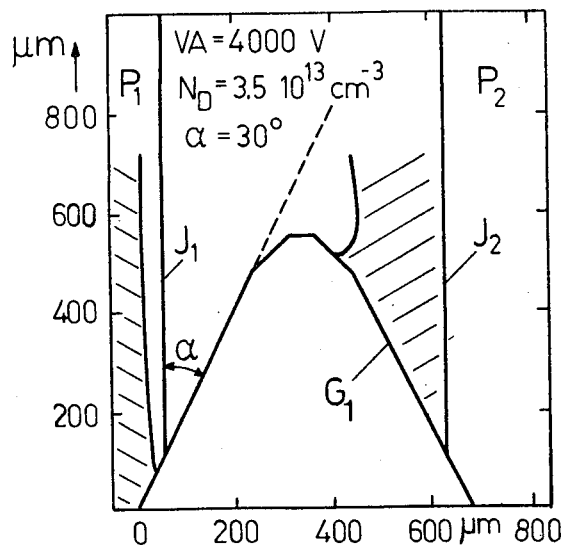
FIG. 3 shows the formation of the blocking layer at 4000 V in a doubly positive tapered element with a 30° angle in both tapers.

The lateral contour shown in FIG. 2 is that of a silicon unit made in this form and tested at 6000 V. Since it was shaped by sand blasting, the tapers $A_1$ and $A_2$ are not straight. The average angle of this contour is obtained then, e.g., by proceeding outwards in equal increments from the bottom of the notch, going in the x direction and measuring the angle $\alpha$ at each step. Adding the results and dividing by the number of steps gives the average angle $\alpha_m$.

Essentially the same result is obtained by fitting straight lines $g_1$ and $g_2$ to the curves forming the contour, using the method of least squares, and determining the angles these lines make with the pn junctions $J_1$ and $J_2$.

It is to be noted that the straight lines $g_1$ and $g_2$ intersect a line $g_3$ parallel to the central axis Z and tangent to the bottom of the groove in two points $S_1$ and $S_2$ which are more than 40 $\mu$m apart. This fact will be explained further below.

The thickness $w$ of region N is 870 $\mu$m, the thickness $d$ of zones $P_1$ and $P_2$ is about 90 $\mu$m, and so the total thickness $h$ is about 1050 $\mu$m. The radius of the element is 19 mm and thus its diameter is 38 mm.

The resistivity of the silicon wafer in region N is 220–260 Ω cm. The wafer is cut parallel to the (111)-plane and lapped with carborundum.

To produce zones $P_1$ and $P_2$ the silicon wafer was simultaneously diffused with boron and aluminum. In this way a boron concentration of $5 \times 10^{20}$ cm$^{-3}$ and an aluminum concentration of $5 \times 10^{16}$ cm$^{-3}$ was achieved in the surface layers. The diffusion depths were from 38 $\mu$m to 90 $\mu$m. The lifetime of the carriers in region N was from 30 to 60 $\mu$ sec. as measured by the Zimmermann method (Phys. stat. sol. (a) 12, 671 (1972): Ref. 11).

Why the structures of FIGS. 1 and 2 exhibit optional blocking behavior, and in particular can be used to block voltages never attained before, and even considered unattainable on the basis of cost of reproducibility will be explained below with reference to FIGS. 3–12.

It is known that with simple positive tapers (dashed lines in FIGS. 3 and 4) a field strength distribution at the lateral surface is produced, the maximum of which lies deep in the lower doped zone N. The maximum becomes smaller and recedes farther from pn junction $J_1$, the smaller the angle $\alpha$ is made. With angles above about 60°, the maximum occurs at the pn junction $J_1$. All this is known, e.g., from Ref. 3 and 4.

If, however, the surface M of the element is now doubly positively tapered according to the geometry $G_1$, the relationships become much more complex because then the blocking layer, i.e., the zone between the two shaded regions, must extend out around the bottom of the groove.

As was found by numerical computations on an electronic data processing installation, the principles of which are presented in Ref. 4, there occurs then, along with the field strength maximum influenced by the simple taper, a second maximum in the region of the bottom of the groove, or more precisely put, just there where the contour has its smallest radius of curvature.

Figure 4:
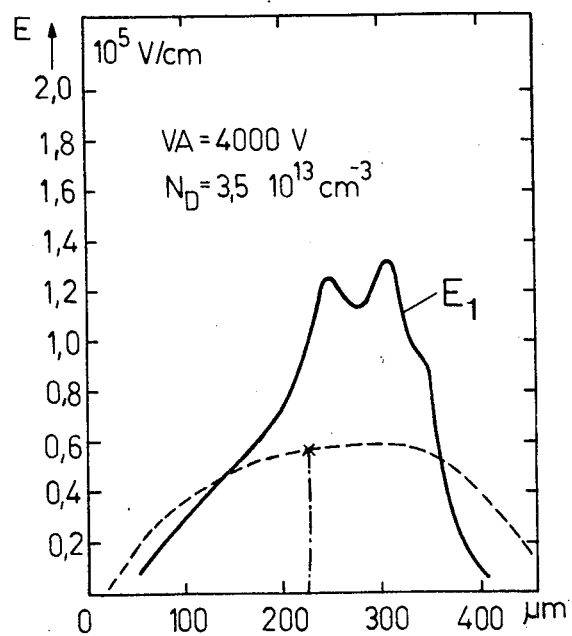
FIG. 4 shows the distribution of the electric field strength in the lateral surface of the element shown in FIG. 3.

As is seen from FIG. 4, with a 30° taper, the two maxima almost coincide and there results a rather broad maximum according to curve $E_1$.

In view of this it becomes clear that the field strength characteristic can be improved by separating the two maxima, which can be done by choosing a larger angle $\alpha$ (the first maximum then approaches the pn junction $J_1$) and the location of the greatest curvature is as far as possible from the pn junctions $J_1$, $J_2$.

Figure 5:
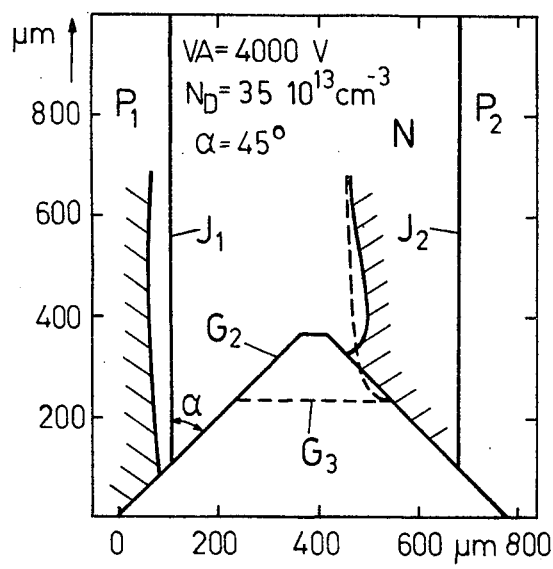
FIG. 5 shows the formation of the blocking layer at 4000 V in a doubly positive tapered element with angles of 45° only.
Figure 6:
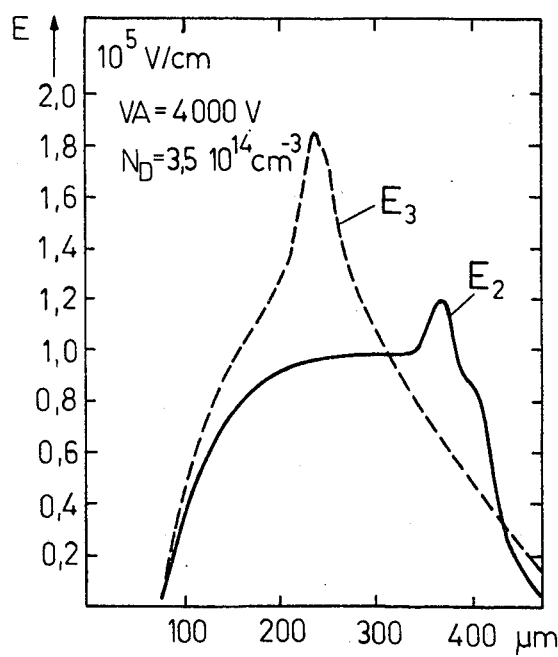
FIG. 6 shows the resulting field distributions in such an element.

This is demonstrated by means of FIGS. 5 and 6.

FIG. 5 shows a deep groove $G_2$ and a shallow one $G_3$, to which correspond the field curves $E_2$ and $E_3$ of FIG. 6. Both grooves have 45° tapers.

For the geometry $G_2$ it results that, in fact, the two field strength maxima draw apart so that, cf., $E_2$ in FIG. 6, a flatter field strength is really smaller than in FIG. 4, through not remarkably so, since the maximum of the simple positive taper is greater at 45° than at 30°.

With geometry $G_3$ the location of maximum curvature is shifted nearer to pn junction $J_1$. Thus the higher maximum at the pn junction produced by the larger angle $\alpha$ and the maximum at the location of maximum curvature coincide which leads in this case to a very high field strength maximum ($E_3$ in FIG. 6).

Figure 7:
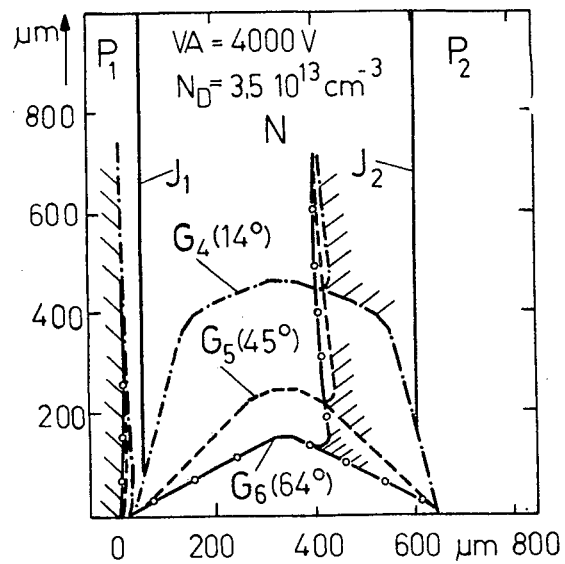
FIG. 7 shows the configuration of the blocking layers at 4000 V in tapers of 14°, 45° and 64°.
Figure 8:
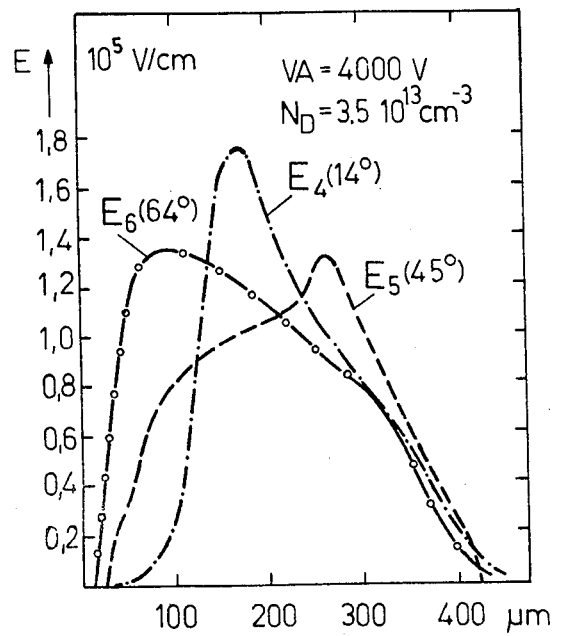
FIG. 8 shows the lateral surface field distributions for the contours of FIG. 7.

The influences of the taper angle $\alpha$ and the location of maximum curvature are shown in FIGS. 7 and 8 where geometries $G_4$, $G_5$ and $G_6$ with angles of 14°, 45° and 64° are investigated with different groove depths.

From the corresponding field strength curves $E_4$, $E_5$ and $E_6$ of FIG. 8 it is apparent that the 45° angle is the most favorable for realistic contours.

With the geometry $G_4$ there is quite a steep taper angle (14°) and correspondingly with a simple positive taper there is a sharp reduction of the field strength maximum at the surface. Since, for reasons of mechanical stability, the notching of the silicon wafer must reach some limit and since, for small angles of taper, the first field strength maximum, for a simple positive taper, lies far from the pn junction, the curvature point of the geometry cannot be located far enough from the pn junction.

With geometry $G_6$, maximum curvature is in the center of the wafer. The maximum field strength point is determined by the simple positive taper and lies relatively close to the pn junction. The taper angle however is very flat (64°) and the maximum field strength with simple positive taper is not very sharply reduced.

The geometry $G_5$ (45° taper) lies between these two extremes. It does not exactly represent the optimum but shows that an optimization is possible.

Figure 9:
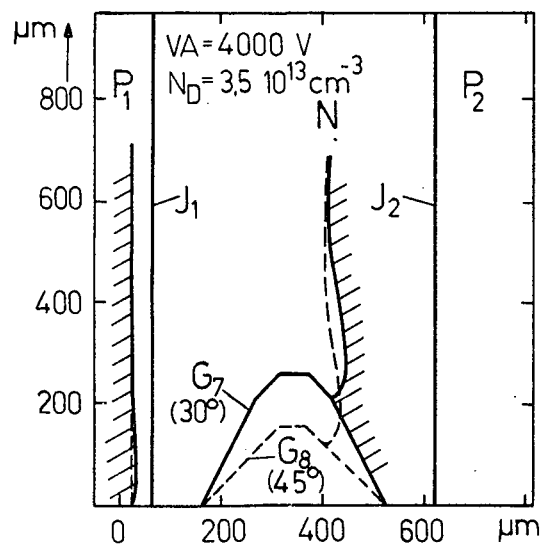
FIG. 9 shows the configuration of the blocking layers at 4000 V with tapers of 30° and 45°, but with the pn junctions outside the tapers on the lateral surface.
Figure 10:
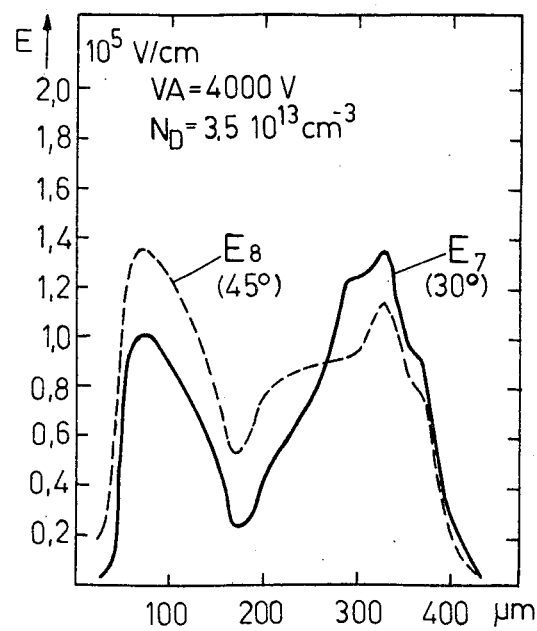
FIG. 10 shows the field distributions at the lateral surface for the contours in FIG. 9.

All the geometries discussed so far have tapers which intersect the pn junctions. It follows from this that the thickness of the edges of the wafer is limited by the p diffusion depth. For reasons of mechanical stability, a geometry without this limitation would be preferable. Such a geometry is shown in FIG. 9. The groove here lies entirely in the N region. In this case too there are two field strength maxima (FIG. 10) the first near the pn junction and the second at the point of strongest concave curvature. In between these is, in addition, a convex curvature which produces a reduction in the field strength between the two maxima.

With geometry $G_7$, the field strength has its maximum at the point of greatest curvature. In order to reduce this curvature, the taper angle was increased in $G_8$ from 30° to 45°. The maximum field strength was then found to occur in the vicinity of the pn junction. It is clear that with this geometry there are available two optimizing parameters: the angle of taper and the distance between the point at which the taper begins and the pn junction. In this way approximately the same field strength can be obtained as with the above described geometries.

Figure 11:
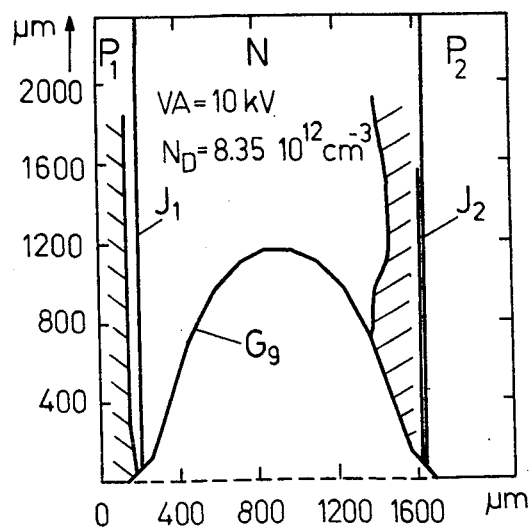
FIG. 11 shows the configuration of the blocking layer at 10,000 V and an average angle $\alpha_m$ of 30° for the tapers.
Figure 12:
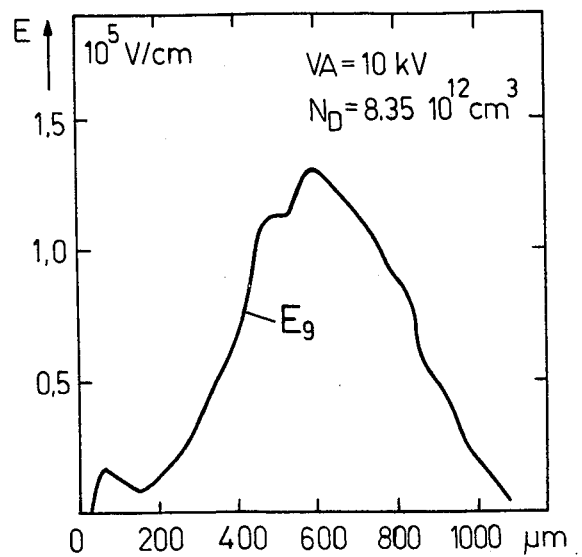
FIG. 12 shows the field distribution on the lateral surface for the contours of FIG. 11.

FIGS. 11 and 12 show a structure with lateral geometry $G_9$ for blocking 10,000 volts, i.e., the region N has a doping of only $N_D = 8.35 \times 10^{12}$ cm$^{-3}$ and the thickness of the portion of the space charge region of the blocking layer found in it plus at least two minority carrier diffusion lengths $L_p$ is known to be necessary to keep the off current as small as possible until an avalanche breakdown occurs (cf. e.g., Ref. 2, p. 478). The resulting field strength distribution $E_9$ is shown in FIG. 12. A somewhat more complicated geometry than in FIGS. 3, 5, 7 and 9 was chosen. Such geometries were also investigated for 4 kv - structures without, however, any essential change in the results.

The preceding gives rise to the following conclusions.

The optimal structure for a high voltage semiconductor power unit of the above described type is distinguished by the fact that the lateral surface of the element is doubly positive tapered with angles between 30° and 60°. Preferably the angle of taper $\alpha_m$ lies between 40° and 45°. The structure reacts less sensitively at large angles than at small ones for which the field strength maxima easily coalesce.

In contrast to negative positive tapered elements the circumferential groove produced by the two tapers $A_1$, $A_2$ is symmetric and the blocking layers form in the same way at both pn junctions $J_1$ and $J_2$.

It is particularly significant that the semiconductor element can be made so that the pn junctions $J_1$ and $J_2$ appear at the lateral surface M outside the tapers $A_1$, $A_2$. However care must be taken to separate the places $K_1$, $K_2$ (FIG. 1) where the tapers $A_1$ and $A_2$ begin from the adjacent locations $B_1$ and $B_2$ where the pn junctions $J_1$, $J_2$ emerge, by no more than 30% of the thickness $w$ of the zone N. Should the distance $K_1 - B_1$ or $K_2 - B_2$ be chosen larger then this there would would occur an undesired sharp increase in the left-hand maximum of curves $E_7$ and $E_8$ in FIG. 10.

On the basis of this information a semiconductor power element can be produced, the thickness of which from the points $K_1$ and $K_2$ to the corresponding end surfaces would be, for example, $0.3 \times 870$ μm + 90 μm = 350 μm and the width of the groove would then be only about 260 μm. Such an element is technologically much less of a problem than the known elements in which the taper is permitted to begin in the zones $P_1$, $P_2$, or less than 90 μm below the end surfaces. In these known elements there is naturally increased danger of chipping the rim of the groove.

It is also clear now why the bottom of the groove in FIGS. 1 and 2 is to have the width $m > 40$ μm. In that way the radius of curvature is prevented from being so small that the field strength maximum at the point of maximum curvature exceeds the critical field strength for an avalanche breakdown in the silicon element.

On the other hand $m$ naturally also must not be too large since then the field strength maximum at the point of maximum curvature would come too close to the maximum at the pn junction. For this reason it is advantageous to choose $m$ also to be smaller than 0.2 $w$, so that the resulting groove depth in accordance with the invention lies between 150 and 850 μm for a 6 kv element.

As shown by the investigations, the doping profile in the zones $P_1$, $P_2$ has practically no influence on the voltage blocking behavior of the element. This also is understandable since the field strength maximum always lies in the zone N. This has an important technological advantage over negatively tapered elements because not only must intolerably small angles be used in the latter for blocking high voltages but also a flatter diffusion profile must be used, which, however, is tolerable only up to a certain point on account of the longer diffusion times involved.

From the foregoing it follows that with the same diffusion profile and the same geometric contour practically the whole range above 3500 volts is attainable, up to 10,000 volts or more. It is merely necessary that the doping of zone N and its thickness $w$ be suited to the intended voltage.

In sum, there is a universal structure for voltage blocking above 3.5 kv if the doping of the zone N between the two pn junctions $J_1$, $J_2$ is less than $3.5 \times 10^{13}$ cm$^{-3}$ and its thickness $w$ is about equal to the thickness of the portion of the space charge region at maximal voltage blocking found in it plus at least two minority carrier diffusion lengths, and if the circumferential groove due to the two tapers $A_1$, $A_2$ has essentially a trapezoidel cross section with the angle of inclination $\alpha_m$ of the trapezoid arms to the pn junction $J_1$, $J_2$ between 40° and 45°, and the base line of the groove bottom longer than 40 μm. The thickness $w$ lies in practice between about 400 μm for 3.5 kv and up to 1500 μm for 10 kv, with these values of course strongly dependent on the material, which can exhibit different recombination centers and thus different diffusion lengths. As a rule of thumb it can be assumed: $w$=highest voltage blocked (kv) × 100 μm /kv + 2 × diffusion length.

Figure 13:
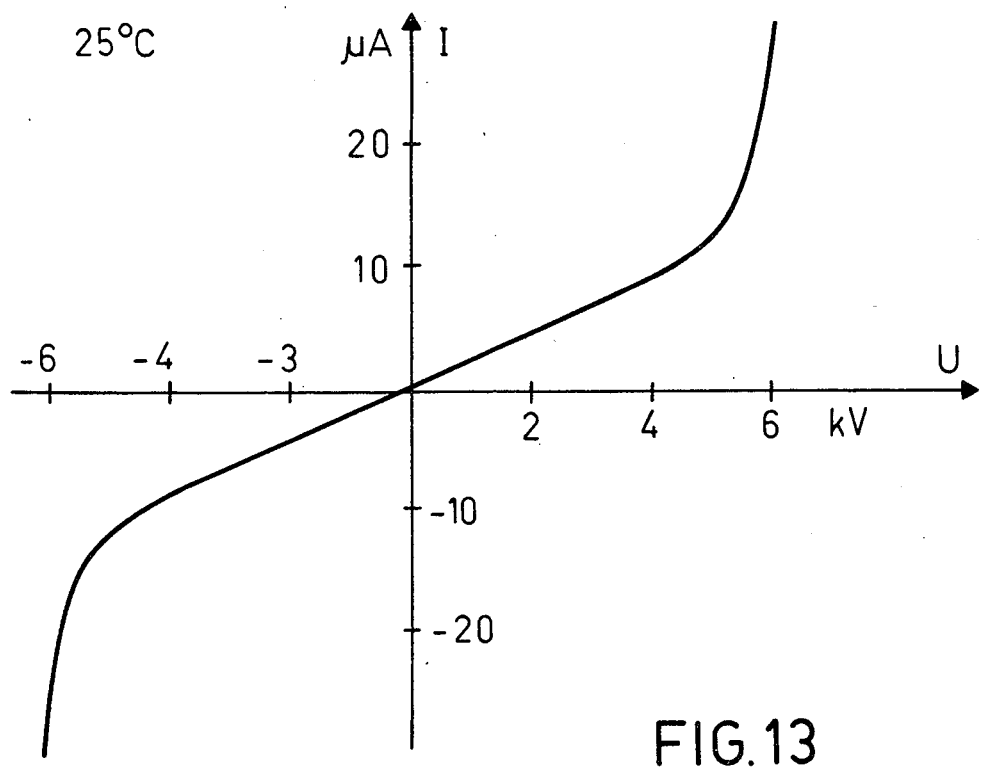
FIG. 13 is a current-voltage characteristic of the element of FIG. 2 at 25°C.
Figure 14:
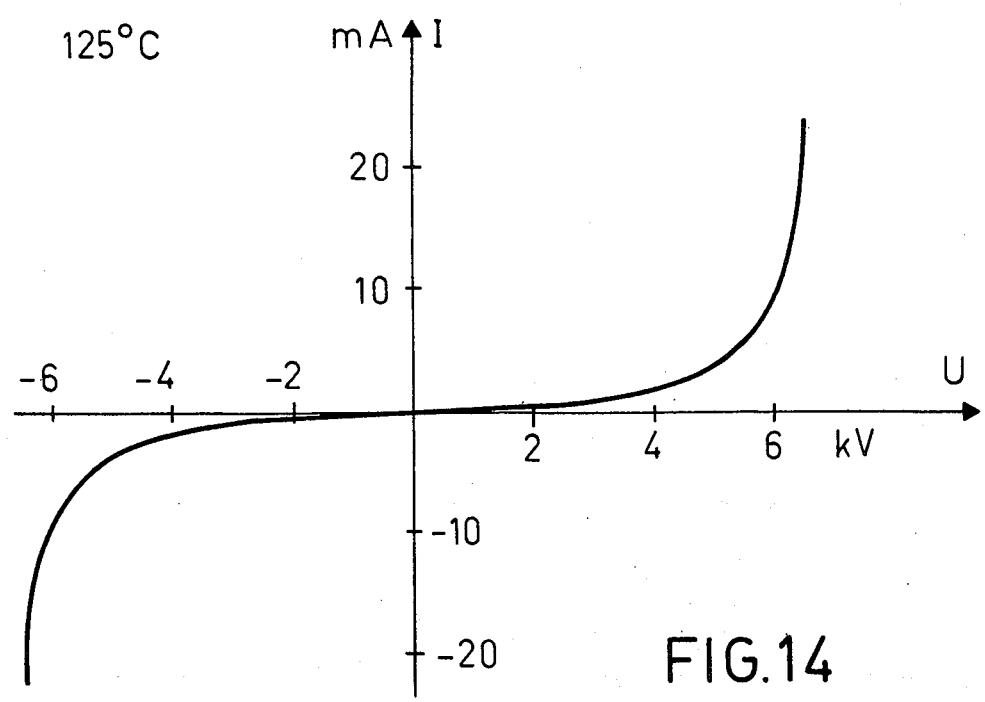
FIG. 14 is a current-voltage characteristic of the element of FIG. 2 at 125°C.

An especially stable and easily made element is obtained if, as already mentioned above, the locations $B_1$ and $B_2$ of emergence of the pn junctions $J_1$ and $J_2$ are outside the tapers $A_1$ and $A_2$, and indeed, to the extent that the distance $K_1 - B_1$ or $K_2 - B_2$ is about 15–25% of the thickness $w$ of zone N. The current voltage characteristics of the element of FIG. 2 shown in FIGS. 13 and 14 clearly indicate that the element can be loaded up to its volume breakdown voltage of 6 kv without causing a surface breakdown. Noteworthy is the very small scale or ordinates showing the fine details of the off current curve. It follows from an analysis of the curves that the measured off current is produced exclusively by thermal pair formation, and there is no contribution from the surface.

It remains to be pointed out that with structures conforming to the invention the field strength on the lateral surface M of the element cannot be reduced significantly below $1.2 \times 10^5$ V/cm, while with negative tapers surface field strengths of $0.7 \times 10^5$ V/cm can be reached. It can be shown, however, (Ref. 4, FIG. 12), that positive taper surface field strengths to $1.5 \times 10^5$ V/cm still produce no impairment of the reverse characteristic. The lower value of $0.7 \times 10^5$ V/cm with negative taper is really necessary because there occurs just under the surface an absolute field strength maximum (Ref. 4, FIG. 4) which, for values greater than $0.7 \times 10^5$ V/cm on the surface, exceeds the value for internal breakdown of about $2 \times 10^5$ V/cm.

In summary, the structures conforming to the invention offer the following surprising, important and mostly unforeseeable advantages:

There is practically no loss of active element surface because a groove depth of only about 0.5 mm is sufficient. In contrast, negatively tapered elements have surface lossess around 30%.

The same lateral surface contour can be used to block practically all voltages, while negatively tapered elements must have smaller angles as the voltage to be blocked increases, so that in practice a voltage of about 3500 V cannot be exceeded.

The diffusion profile of zones $P_1$, $P_2$ is independent of the blocked voltage, while with negative tapers an increasingly flatter profile and therefore increased diffusion times must be accepted with increasing voltage.

For the reduced doping of region N necessary for blocking high voltages the surface field strength of structures conforming to the invention drops. On the other hand, for negatively tapered elements it rises.

The end planes of the element can make contact with the heat sinks with no border left over, so that the cooling problem is lessened.

There exists no field strength maximum which exceeds the maximum for internal breakdown, as in the negatively tapered elements. This maximum present in negatively tapered elements has the known effect that the theoretical breakdown voltage for such elements can never be attained. For structure conforming to the invention, however, the theoretical breakdown voltage is attainable.

In conclusion it is yet to be pointed out that the boundary of the blocking layer associated with the forward biased pn junction ($J_2$ in the examples) can have the tendency to advance towards this junction in the region of the groove. This could result in punch-through which, however, must of course be avoided. Care must therefore be taken that there is no high dielectric-constant layer on the lateral surface M.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A semiconductor power element comprising two successive opposed polarity planar pn junctions, said element being positively tapered on its lateral surface in the regions of both pn junctions to form an average angle of both tapers of between 30° and 60°, the pn junctions appearing on the lateral surface of the semiconductor element outside of the tapers, the places on the lateral surface where the tapers begin being separated from the adjacent locations of emergence of the pn junctions on the lateral surface by no more than 30% of the thickness of the region between the two pn junctions.

2. A semiconductor power element comprising two successive opposed polarity planar pn junctions, said element being positively tapered on its lateral surface in the regions of both pn junctions to form an average angle of both tapers of between 30° and 60°, the straight lines intersecting the central axis of the element and fitted to the tapers by the method of least squares intersecting a straight line parallel to the central axis and tangent to the bottom of the groove in two points which are separated by a distance of at least 40 μm, the mentioned distance being no greater than 20% of the thickness of the region between the two pn junctions.

3. A semiconductor power element comprising two successive opposed polarity planar pn junctions, said element being positively tapered on its lateral surface in the regions of both pn junctions to form an average angle of both tapers of between 30° and 60°, the pn junctions appearing on the lateral surface of the semiconductor element outside of the tapers, the places on the lateral surface where the tapers begin being separated from the adjacent points of emergence of the pn junctions on the lateral surface by 15–25% of the thickness of the zone between the two pn junctions.

* * * * *